United States Patent
Chang et al.

(10) Patent No.: US 6,690,065 B2
(45) Date of Patent: Feb. 10, 2004

(54) SUBSTRATE-BIASED SILICON DIODE FOR ELECTROSTATIC DISCHARGE PROTECTION AND FABRICATION METHOD

(75) Inventors: Chyh-Yih Chang, Hsinghuang (TW); Ming-Dou Ker, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/749,377

(22) Filed: Dec. 28, 2000

(65) Prior Publication Data

US 2002/0086467 A1 Jul. 4, 2002

(51) Int. Cl.[7] .............................................. H01L 23/62
(52) U.S. Cl. ........................................ 257/355; 257/173
(58) Field of Search ........................ 257/173, 355–363, 257/546

(56) References Cited

U.S. PATENT DOCUMENTS

| | | |
|---|---|---|
| 4,939,616 A | 7/1990 | Rountre |
| 5,012,317 A | 4/1991 | Rountre |
| 5,225,702 A | 7/1993 | Chatterjee |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A | 5/1997 | Ker et al. |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,907,462 A | 5/1999 | Chatterjee et al. |
| 5,910,874 A | 6/1999 | Iniewski et al. |
| 5,923,067 A * | 7/1999 | Voldman ................ 257/349 |
| 5,932,918 A | 8/1999 | Krakauer |
| 5,940,258 A | 8/1999 | Duvvury |
| 5,990,520 A | 11/1999 | Noorlag et al. |
| 6,015,992 A | 1/2000 | Chatterjee et al. |
| 6,034,397 A | 3/2000 | Voldman |
| 6,081,002 A | 6/2000 | Amerasekera et al. |
| 6,218,895 B1 * | 4/2001 | De et al. ................ 257/299 |

FOREIGN PATENT DOCUMENTS

EP          753892 A1  *  1/1997

OTHER PUBLICATIONS

M–D. Ker, et al., "CMOS On–Chip ESD Protection Design with Substrate–triggering Technique," Proc. of ICECS, vol. 1, pp. 273–276, 1998.
C. Duvvury et al., "Dynamic Gate Coupling for NMOS for Efficient Output ESD Protection", Proc. of IRPS, pp. 141–150, 1992.

(List continued on next page.)

*Primary Examiner*—Amir Zarabian
*Assistant Examiner*—Jamie L. Brophy
(74) *Attorney, Agent, or Firm*—Finnegan, Henderson, Farabow, Garrett & Dunner, L.L.P.

(57) ABSTRACT

An integrated circuit device that includes a semiconductor substrate, a well region formed inside the semiconductor substrate, a first isolation structure formed inside the well region, a second isolation structure formed inside the well region and spaced apart from the first isolation structure, a dielectric layer formed over the well region, and a layer of silicon, formed over the dielectric layer, including a p-type portion, an n-type portion and a center portion disposed between the p-type and n-type portions.

13 Claims, 10 Drawing Sheets

OTHER PUBLICATIONS

N. K. Verghese and D. Allstot, "Verification of RF and Mixed–Signed Integrated Circuits for Substrate Coupling Effects", in *Proc. of IEEE Custom Integrated Circuits Conf.*, 1997, pp. 363–370.

M.Xu, D. Su, D. Shaeffer, T.Lee, and B. Wooley, Measuring and Modeling the Effects of Substrate Noise on LNA for a CMOS GPS Receiver, *IEEE Journal of Solid–State Circuits*, vol. 36, pp. 473–485, 2001.

R. Gharpurey, "A Methodology for Measurement and Characterization of Substrate Noise in High Frequency Circuits," in *Proc. of IEEE Custom Integrated Circuits Conf.*, 1999, pp. 487–490.

M. Nagata, J. Nagai, K. Hijikata, T. Morie, and A. Iwata, PhysicalDesign Guides for Substate Noise Reduction in CMOS Digital Circuits, *IEEE Journal of Solid–State Circuits*, vol. 36, pp. 539–549, 2001.

M.–D. Ker, T–Y, Chen, C–Y. Wu, and H.–H. Chang, ESD Protection Design on Analog Pin WIth Very Low Input Capacitance for High–Frequency or Current–Mode Applications, *IEEE Journal of Solid–State Circuits*, vol. 35, pp. 1194–1199, 2000.

M.–D. Ker, Whole–Chip ESD Protection Design with Efficient VDD–to–VSS ESD Clamp Circuit for Submicron CMOS VLSI, *IEEE Trans. on Electron Devices*, vol. 46, pp. 173–183, 1999.

C. Richier, P. Salome, G. Mabboux, I. Zaza, A. Juge, and P. Mortini, Investigation on Different ESD Protection Strategies Devoted to 3.3V RF Applications (2 (GHz) in a 0.18 µm CMOS Process, in Proc. of EOS/ESD Symp., 200, pp. 251–259.

T.–Y. Chen and M.–D. Ker, "Design on ESD Protection Circuit With Low and Constant Input Capacitance," *in Proc. of IEEE Int. Symp. on Quality Electronic Design*, 2001, pp. 247–247.

M.–D. Ker, T.–Y. Chen C. Yo Wu, and H.–H. Chang, ESD Protection Design on Analog Pin WIth Very Low Input Capacitance for RF or Current–Mode Applications, *IEEE Journal of Solid–State Circuits*, vol. 35, pp. 1194–1199, 2000.

S.Voldman, et al. , "Semiconductor Process and Structural Optimization of Shallow Trench Isolation–Defined and Polysilicon–Bound Source/Drain Diodes for ESD Networks," in Proc. of EOS/ESD Symp., 1998, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp. 823–825, Jul. 1995.

G.P. Singh, et al., "High–Voltage–Tolerant I/OBuffers with Low–Voltage CMOS Process," IEEE Journal of Solid–State Circuits, vol. 34, No. 11, pp. 1512–1525, Nov. 1999.

H. Sanchez, et al., A Versatile 3.3/2.5/1.8–V CMOS I/O Driver Built in 02. –µm, 3.5–nm Tox, 1.8–V CMOS Technology, IEEE Journal of Solid–State Circuits, vol. 34 No. 11.pp. 1501–1511, Nov. 1999.

* cited by examiner

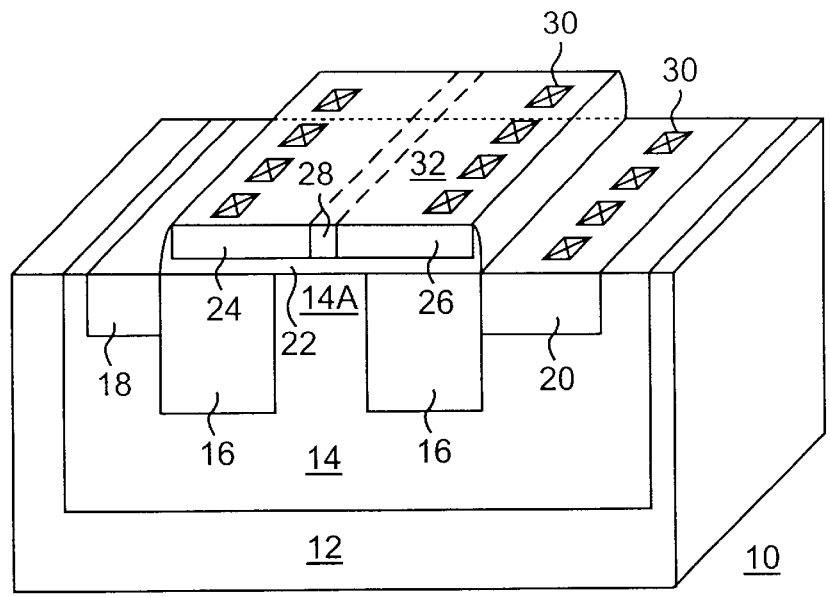
FIG. 4
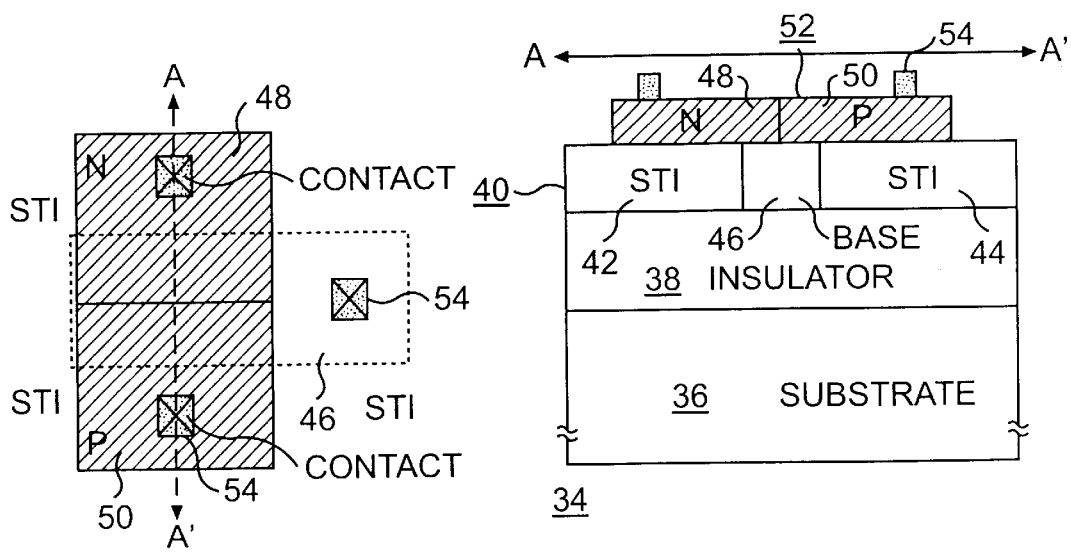
FIG. 7  FIG. 6

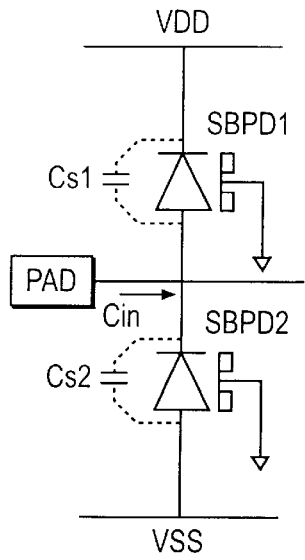 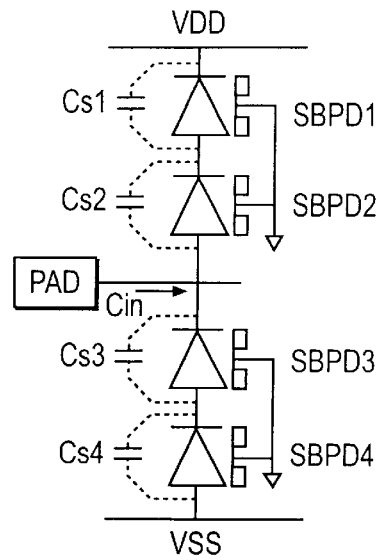 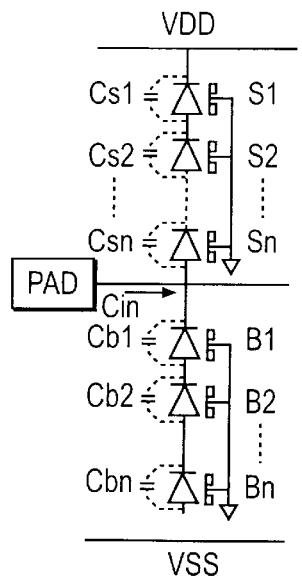
FIG. 13A     FIG. 13B     FIG. 13C
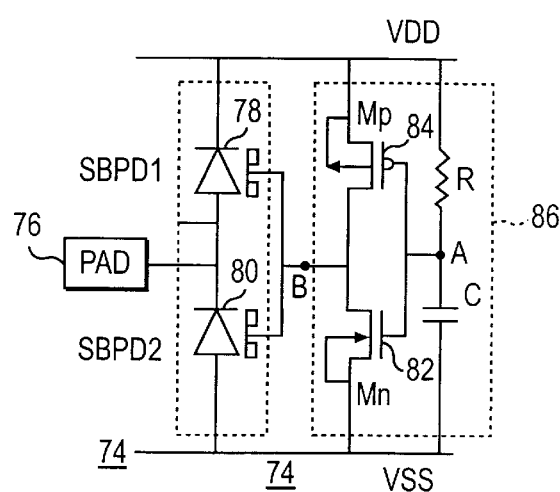
FIG. 14

US 6,690,065 B2

SUBSTRATE-BIASED SILICON DIODE FOR ELECTROSTATIC DISCHARGE PROTECTION AND FABRICATION METHOD

BACKGROUND OF THE INVENTION

1. Field of the Invention

This invention pertains in general to a semiconductor device, and, more particularly, to a substrate-biased silicon diode and a method for making the same.

2. Description of the Related Art

A semiconductor integrated circuit (IC) is generally susceptible an electrostatic discharge (ESD) event, which may damage or destroy the IC. An ESD event refers to a phenomenon of electrical discharge of a current (positive or negative) for a short duration in which a large amount of current is provided to the IC. The high current may be built-up from a variety of sources, such as the human body. Many schemes have been implemented to protect an IC from an ESD event. A common protection scheme is using a parasitic transistor associated with an n-type metal-oxide semiconductor (MOS) with the source coupled to ground and the drain connected to the pin to be protected from an ESD event.

Diodes or diode-coupled transistors have been used for ESD protection in radio-frequency (RF) applications. In a RF IC, an on-chip ESD circuit should ideally provide robust ESD protection, while exhibiting minimum parasitic input capacitance and low voltage-dependency. In deep-submicron complementary metal-oxide semiconductor (CMOS) process technology with shallow-trench isolations (STIs), a diode has been used for ESD protection and is generally formed contiguous with either an $N^+$ or $P^+$ diffusion region in a semiconductor substrate. FIG. 1A shows a cross-sectional view of a known diode ESD protection structure formed in an IC. Referring to FIG. 1A, a $P^+$ diffusion region is bound by STIs on either side, and therefore the diode formed by the STI is also known as an STI-bound diode. The STI-bound diode exhibits a bottom capacitance, $C_{bottom}$. However, an STI-bound diode has been found to have significant leakage current due to an interference between a silicide layer (not shown) of the $P^+$ diffusion region and the STIs around the $P^+$ region.

FIG. 1B shows a cross-sectional view of another known diode ESD protection structure, known as a polysilicon-bound diode, introduced to address the leakage current problem with an STI-bound diode. The $P^+$ diffusion region in a polysilicon-bound diode is now defined by a polysilicon gate, and therefore the leakage current from the edges of STIs is eliminated. However, the total parasitic capacitance of the polysilicon-bound diode is larger than that of the STI-bound diode because of the addition of the sidewall junction capacitance of the $P^+$ diffusion region.

FIG. 2 is a circuit diagram showing a known ESD protection scheme using dual diodes. Referring to FIG. 2, the combination of the dual-diode structures and $V_{DD}$-to-$V_{SS}$ ESD clamp circuit provides a path for an ESD current 2 to discharge, instead of through the internal circuits. When ESD current 2 is provided to signal a pad PAD1, and with a signal pad PAD2 relatively grounded, ESD current 2 is conducted to $V_{DD}$ through Dp1. ESD current 2 is discharged to $V_{SS}$ through the $V_{DD}$-to-$V_{SS}$ ESD clamp circuit and flows out of the IC from Dn2 to PAD2. Diode Dp1 has a capacitance of Cp1 and diode Dn1 has a capacitance of Cn1. The total input capacitance $C_{in}$ of the circuit shown in FIG. 2 primarily comes from the parasitic junction capacitance of diodes, and is calculated as follows:

$$C_{in}=Cp1+Cn1$$

wherein Cp1 and Cn1 are parasitic junction capacitances of diodes Dp1 and Dn1, respectively.

FIG. 3 is plot showing the relationship between a pad voltage and parasitic input capacitance of the circuit shown in FIG. 2. Referring to FIG. 3, when the voltage on the pad increases, the parasitic junction capacitance of Dp1 increases and the parasitic junction capacitance of Dn1 decreases. Therefore, the total input parasitic capacitance $C_{in}$ is nearly constant. This characteristic is important in RF applications. However, the total parasitic capacitance of a polysilicon-bound diode, as compared to an STI-bound diode, is increased because of the addition of a sidewall capacitance, $C_{sidewall}$, as shown in FIG. 1B.

SUMMARY OF THE INVENTION

Accordingly, the present invention is directed to a substrate-biased silicon diode and a method for making the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided an integrated circuit device that includes a semiconductor substrate, a well region formed inside the semiconductor substrate, a first isolation structure formed inside the well region, a second isolation structure formed inside the well region and spaced apart from the first isolation structure, a dielectric layer disposed over the well region, and a layer of silicon, formed over the dielectric layer, including a p-type portion, an n-type portion and a center portion disposed between the p-type and n-type portions, wherein the p-type portion overlaps the first isolation structure and the n-type portion overlaps the second isolation structure.

Also in accordance with the present invention, there is provided an integrated circuit device receiving signals from a signal pad that includes at least one substrate-biased silicon diode responsive to the signals from the signal pad for providing electrostatic discharge protection from the signals.

In one aspect of the invention, each of the at least one substrate-biased silicon diode includes a p-type silicon portion, an n-type silicon portion and a center silicon portion disposed between and contiguous with the p-type and n-type silicon portions.

In another aspect of the invention, there additionally includes a detection circuit for detecting the signals from the signal pad and providing a bias voltage to the at least one substrate-biased silicon diode.

Further in accordance with the present invention, there is provided an integrated circuit device receiving signals from a signal pad that includes a first plurality of serially coupled substrate-biased silicon diodes responsive to the signals from the signal pad for providing electrostatic discharge protection from the signals, each of the first plurality of substrate-biased silicon diodes including a p-portion and an n-portion, a second plurality of serially coupled substrate-biased silicon diodes responsive to the signals from the signal pad for providing electrostatic discharge protection from the signals, each of the second plurality of substrate-biased silicon diodes including a p-portion and an n-portion, and a detection circuit for detecting signals from the signal pad and providing a bias voltage to the first and second plurality of substrate-biased silicon diodes, wherein the signal pad is coupled to the p-portion of one of the first plurality of substrate-biased silicon diodes and the n-portion of one of the second plurality of the substrate-biased silicon diodes Additionally in accordance with the present invention, there is provided an integrated circuit device that comprises a semiconductor substrate, an insulator layer disposed over the semiconductor substrate, a silicon layer disposed over the insulator layer, which includes a first isolation structure formed inside the silicon layer, and a second isolation structure formed inside the silicon layer and spaced apart from the first isolation structure, a dielectric layer disposed over the silicon layer, and a layer of silicon, disposed over the dielectric layer, which includes a p-type portion, an n-type portion and a center portion disposed between and contiguous with the p-type and n-type portions.

Further in accordance with the present invention, there is provided a silicon-on-insulator circuit device receiving signals from a signal pad that includes at least one base-biased silicon diode, responsive to the signals from the signal pad, for providing electrostatic discharge protection.

In one aspect of the invention, the silicon-on-insulator is biased to control the at least one base-biased silicon diode.

Additionally in accordance with the present invention, there is provided a method for protecting a silicon-on-insulator device from electrostatic discharge that includes the steps of providing a signal to the device through a silicon-on-insulator circuit, providing a base-biased silicon diode in the silicon-on-insulator circuit, and protecting the device from electrostatic discharge produced with the base-biased silicon diode.

Also in accordance with the present invention, there is provided a method for protecting a complementary metal-oxide semiconductor device from electrostatic discharge that includes the steps of providing a signal to the device through a complementary metal-oxide semiconductor circuit, providing a substrate-biased silicon diode in the complementary metal-oxide semiconductor circuit, and protecting the device from electrostatic discharge produced from the signal with the substrate-biased silicon diode.

Moreover in accordance with the present invention, there is provided a method for forming a silicon diode that includes the steps of A method for forming a silicon diode, comprising the steps of forming a first silicon layer, forming a first isolation structure and a second isolation structure inside the first silicon layer, the first isolation structure being spaced apart from the second isolation structure, forming a dielectric layer over the silicon layer, forming a second silicon layer over the dielectric layer, forming dielectric spacers contiguous with the second silicon layer, implanting a first impurity having a first concentration into a first portion and a second portion of the second silicon layer, the first portion being contiguous with the second portion and the second portion overlapping a region of the first silicon layer between the first isolation structure and the second isolation structure, implanting a first impurity having a second concentration into the first portion of the second silicon layer, wherein the second concentration is greater than the first concentration, and implanting a second impurity into a third portion of the second silicon layer, wherein the third portion is contiguous with the second portion.

In one aspect of the invention, the steps of implanting a first impurity having a first concentration and implanting a first impurity having a second concentration create a diffused region adjacent one of first and second field isolation structures.

Also in accordance with the present invention, there is provided a method for forming a base-biased silicon diode that includes the steps of forming a first and second isolation structures inside a silicon layer, defining a base region inside the silicon layer, the base region being disposed between and contiguous with the first and second isolation structures, forming a dielectric layer over the well region, forming a layer of silicon over the dielectric layer, implanting a first impurity having a first concentration into a first portion and a second portion of the silicon layer, wherein the first portion is contiguous with the second portion and the second portion overlapping a region of the silicon layer between the first isolation structure and the second isolation structure, implanting a first impurity having a second concentration into the first portion and second portion of the silicon layer, wherein the second concentration is greater than the first concentration, and implanting a second impurity into a third portion of the silicon layer, wherein the third portion is contiguous with the second portion and overlaps the second isolation structure.

Further in accordance with the present invention, there is provided a method for forming a substrate-biased silicon diode that includes the steps of forming a first isolation structure and a second isolation structure spaced apart from the first isolation structure inside a silicon layer, forming a dielectric layer over the silicon layer, forming a layer of silicon having two ends over the dielectric layer, forming dielectric spacers contiguous with the two ends of the silicon layer, implanting a first impurity having a first concentration into a first portion and a second portion of the silicon layer, wherein the first portion is contiguous with the second portion and overlaps the first isolation structure, implanting a second impurity into a third portion of the silicon layer, wherein the third portion is contiguous with the second portion and overlaps the second isolation structure, and implanting a first impurity having a second concentration into the first portion of the silicon layer, wherein the second concentration is greater than the first concentration.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawing:

FIG. 4 shows a cross-sectional view of a silicon diode in accordance with one embodiment of the present invention;

FIG. 6 shows a cross-sectional view of a base-biased silicon diode in accordance with one embodiment of the present invention;

FIG. 7 is a layout diagram of the base-biased silicon diode of FIG. 5;

FIG. 13A is a circuit diagram of one embodiment of an ESD protection circuit using substrate-biased silicon diodes of the present invention;

FIG. 13B is a circuit diagram of one embodiment of an ESD protection circuit using stacked substrate-biased silicon diodes of the present invention;

FIG. 13C is a circuit diagram of another embodiment of an ESD protection circuit using stacked substrate-biased silicon diodes of the present invention; and FIG. 14 is a circuit diagram of one embodiment of an ESD protection circuit with biased dual substrate-biased silicon diodes of the present invention.

DETAILED DESCRIPTION OF THE PREFERRED EMBODIMENTS

Figure 1A:
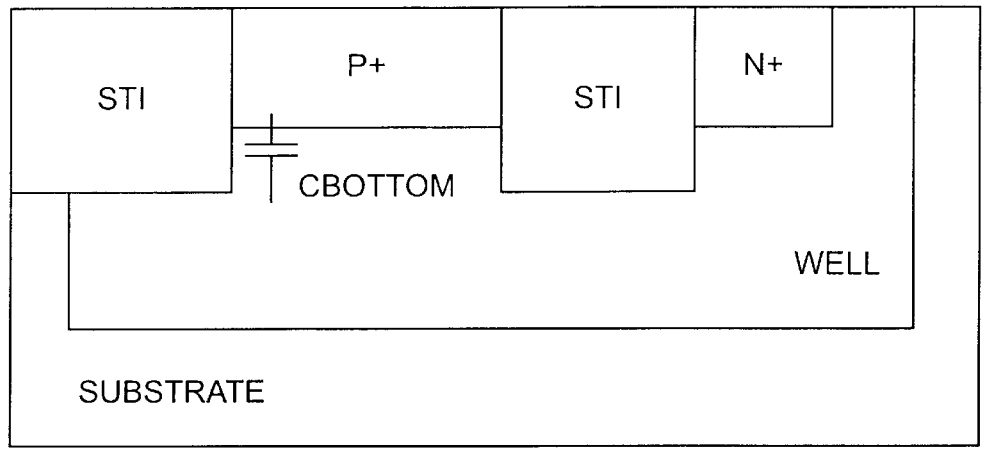
FIG. 1A shows a cross-sectional view of a known diode structure formed in an integrated circuit.

In accordance with the present invention, there is provided a substrate-biased polysilicon diode (SBPD) for ESD protection. The SBPD of the present invention is biased from the substrate for an improved turn-on speed of the SBPD and reduced leakage current. Unlike conventional diodes, an SBPD does not have a bottom junction capacitance and therefore exhibits a relatively smaller junction capacitance. In addition, because an SBPD is disposed over shallow trench isolations (STIs) in a silicon substrate, the silicon area used by the SBPD is reduced, which reduces cost. The SBPD of the present invention additionally provides a substrate-biased function, and therefore provides more flexibility in RF IC applications.

FIG. 4 shows a cross-sectional view of an SBPD in accordance with one embodiment of the present invention. Referring to FIG. 4, an integrated circuit 10 includes a semiconductor substrate 12 and a well region 14 formed inside semiconductor substrate 12. Two isolation structures 16 are formed inside well region 14 and are spaced apart from one another. Isolation structures may be conventional STIs used for device isolation. Integrated circuit 10 also includes a diffused region 20 adjacent one of STIs 16. Diffused region 20 is doped with the same type of impurity as well region 14. Integrated circuit 10 may also include another diffused region 18 adjacent one of STIs 16. In one embodiment of the invention, semiconductor substrate 12 is a p-type substrate, well region 14 is an n-well, and diffused region 20 is an n-type diffused region. The optional diffused region 18 is a p-type diffused region.

A dielectric layer 22 is formed over the well region 14, overlapping STIs 16 and a portion of well region 14A disposed between STIs 16. Dielectric layer 22 may be an oxide layer. A layer of silicon 32, subsequently becomes an SBPD, is disposed over dielectric layer 22. Silicon layer 32 includes a p-type portion 24, an n-type portion 26, and a center portion 28 disposed between p-type portion 24 and n-type portion 26. P-type portion 24 overlaps one of STIs 16 and n-type portion 26 overlaps the other one of STIs 16. Center portion 28 overlaps well region portion 14A. In one embodiment, center portion 28 of silicon layer 32 is doped with an n-type impurity having a doped concentration lower than that of n-type portion 26. In another embodiment, center portion 28 of silicon layer 32 is doped with a p-type impurity having a doped concentration lower than that of p-type portion 24. In addition, in an embodiment in which diffused region 20 is an n-type diffused region, diffused region 20 is adjacent one of STIs 16 and n-type portion 26 of silicon layer 32. A plurality of contacts 30 are formed inside diffused region 20, p-type portion 24 and n-type portion 26 of silicon layer 32.

In operation, SBPD 32 responds to ESD pulses to provide electrostatic discharge protection. Furthermore, well region 14 can be biased to control SBPD 32. In one embodiment, diffused region 20 is biased to cause well region 14 to be biased to control SBPD 32 for providing electrostatic discharge protection.

Figure 5:
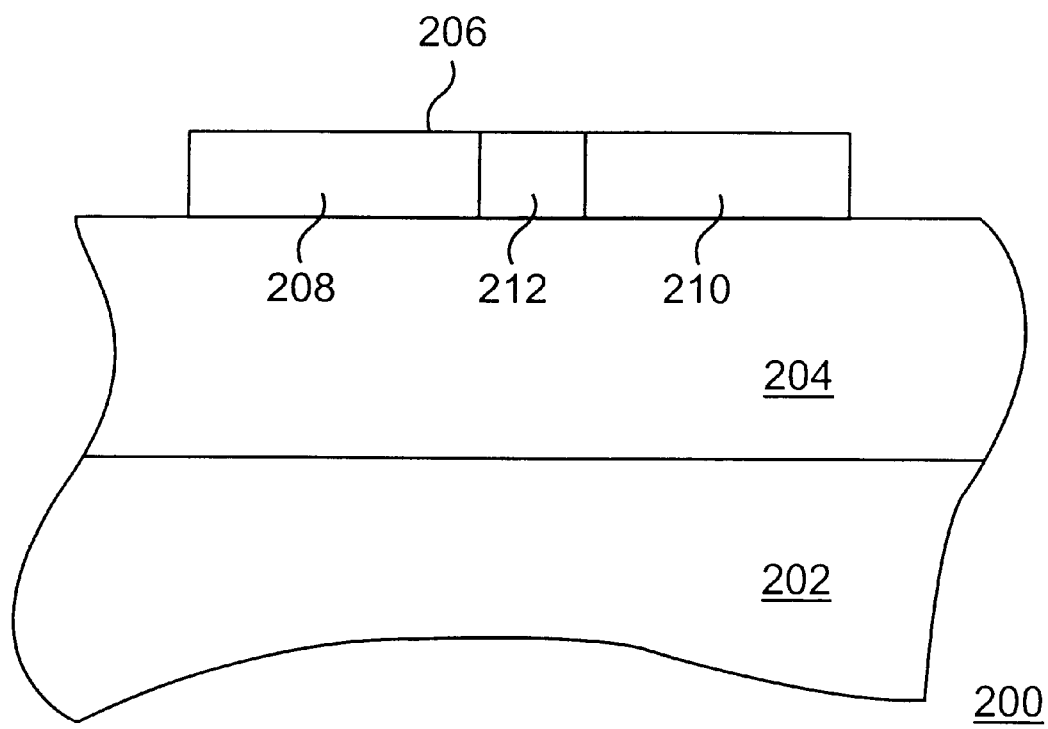
FIG. 5 shows a cross-sectional view of a silicon diode in accordance with another embodiment of the present invention.

FIG. 5 shows a cross-sectional view of a silicon diode in accordance with another embodiment of the present invention. Referring to FIG. 5, an integrated circuit 200 includes a semiconductor substrate 202 and a dielectric layer 204 formed over semiconductor substrate 202. Dielectric layer 204 may comprise a conventional STI. Integrated circuit 200 also includes a layer of silicon 206, subsequently becomes a silicon diode, is disposed over dielectric layer 204. Silicon layer 206 includes a p-type portion 208, an n-type portion 210, and a center portion 212 disposed between p-type portion 208 and n-type portion 210. In one embodiment, center portion 212 is undoped and may be fabricated in a salicide CMOS process. The silicon diode thus formed has no junction in semiconductor substrate 202, eliminating substrate noise coupling.

FIG. 6 shows a cross-sectional view of a base-biased silicon diode in accordance with another embodiment of the present invention. Referring to FIG. 6, the SBPD of the present invention is implemented in a silicon-on-insulator (SOI) CMOS integrated circuit 34. An insulator 38 is disposed over a semiconductor substrate 36. A silicon layer 40 is disposed over insulator layer 38 and includes an isolation structure 42 formed inside silicon layer 40 and an isolation structure 44 formed inside silicon layer 40 and spaced apart from isolation structure 42. Silicon layer 40 also includes a base portion 46 disposed between and contiguous with isolation structures 42 and 44. In one embodiment of the present invention, substrate 36 is a p-type substrate, and isolation structures 42 and 44 are STIs.

A dielectric layer (not shown) is disposed over silicon layer 40, and a layer of polysilicon 52 is disposed over the dielectric layer. Polysilicon layer 52 may also be a silicon layer. Polysilicon layer 52 includes a p-type portion 50, an n-type portion 48 and a center portion (not shown) disposed between and contiguous with the p-type and n-type portions 48 and 50. In addition, p-type portion 50 overlaps isolation structure 44 and n-type portion 48 overlaps isolation structure 42. The center portion of polysilicon layer 52 overlaps base portion 46. Integrated circuit 34 may additional comprise a diffused region (not shown) inside silicon layer 40 adjacent one of isolation structures 42 and 44. Integrated circuit 34 also comprises a plurality of contacts 54.

In operation, insulator layer 38 isolates devices in SOI integrated circuit 34. Thus, silicon diode 52 of the present invention is adapted to be base-biased. The bias supply for based-biased silicon diode 52 may be located on one or both sides of based-biased silicon diode 52 in the form of diffused region adjacent one of isolation structure 42 and 44. Base portion 46 of silicon layer 40 may also be biased to control based-biased silicon diode 52 to provide electrostatic discharge protection. Therefore, this embodiment of the present invention appropriately named a base-biased silicon diode. FIG. 7 is a layout diagram of base-biased silicon diode 52 as shown in FIG. 6 along the A–A' direction.

Figure 8A:
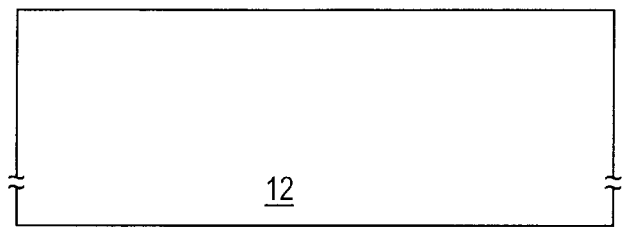
FIGS. 8A–8H are cross-sectional views of the steps in a method of forming a substrate-biased silicon diode with an n-type center region.
Figure 8B:
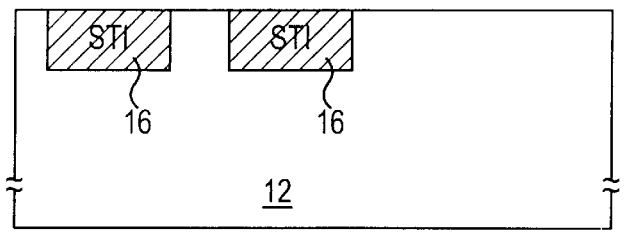

FIGS. 8A–8H are cross-sectional views of the steps in a method of forming a substrate-biased silicon diode of the present invention. Referring to FIG. 8A, a semiconductor substrate 12 is prepared and defined. In one embodiment, semiconductor substrate 12 is a p-type substrate. FIG. 8B shows the formation of STIs 16 inside semiconductor substrate 12. In general, STIs are formed by providing a mask over a substrate. After the mask is patterned and defined, the semiconductor substrate is etched to form shallow trenches spaced apart from one another. A dielectric material, such as silicon dioxide, silicon nitride or silicon oxynitride, is deposited to fill the trenches. The mask is then removed.

Figure 8C:
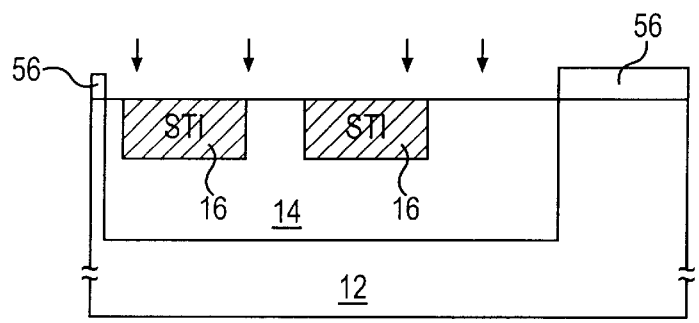

FIG. 8C shows an implantation of impurities to form a well region. Referring to FIG. 8C, after a photoresist 56 is patterned and defined, substrate 12 is doped with an impurity to form well 14. In one embodiment, substrate 12 is doped with an n-type impurity to form an n-well. After implantation, photoresist 56 is removed.

Figure 8D:
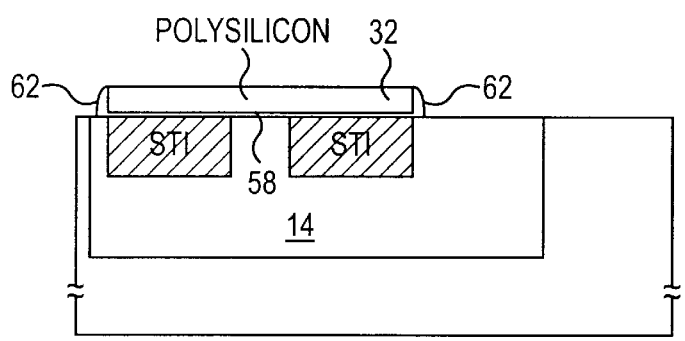

FIG. 8D shows the beginning of the formation of a silicon diode. Referring to FIG. 8D, a thin oxide layer 58 is grown over the surface of well region 14. A layer of silicon 32 is then deposited over oxide layer 58. A photoresist (not shown) is used to pattern and define silicon layer 32 during an etching process to form the structure shown in FIG. 8D. Conventional steps follow to form spacers 62 contiguous with silicon layer 32. Spacers 62 may be oxide spacers or nitride spacers.

Figure 8E:
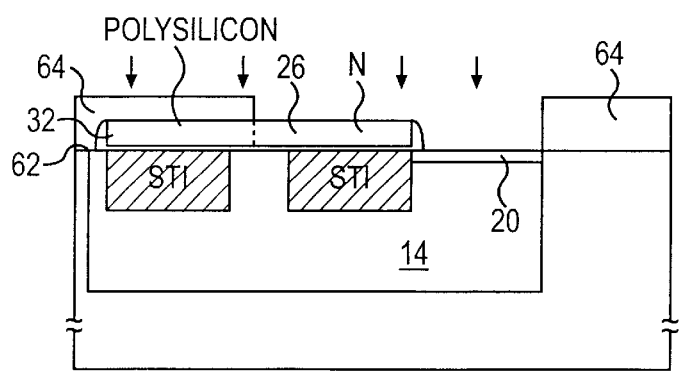

Referring to FIG. 8E, a photoresist 64 is deposited over silicon layer 32, spacers 62, well 14, and substrate 12, and then patterned and defined to expose a first portion 26 of silicon layer 32, a portion of silicon layer 32 that would later become center portion 28, and a portion of well 14. A lightly-doped drain (LDD) of an impurity is implanted into first portion 26, center portion 28, and the exposed portion of well 14. The implanted impurity forms a diffused region 20 in well region 14. Therefore, first portion 26 contains the same type of impurity as center portion 28 and diffused region 20. In one embodiment, an LDD of an n-type impurity is implanted into first portion 26, center portion 28, and diffused portion 20.

Figure 8F:
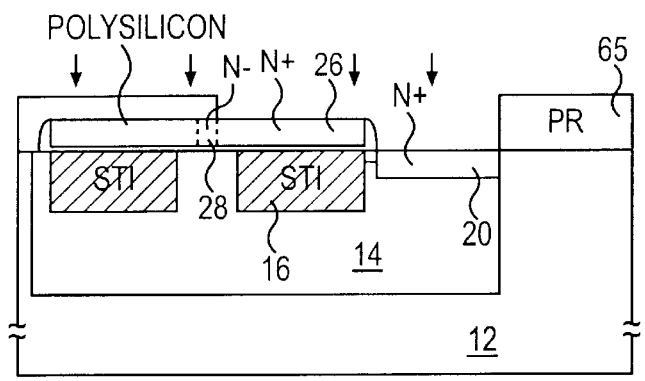

Referring to FIG. 8F, a photoresist 65 is deposited over silicon layer 32, spacers 62, well 14, and substrate 12, and then patterned and defined to expose first portion 26 and diffused region 20. A high concentration of the same type of impurity implanted in FIG. 8E is implanted into first portion 26 and diffused region 20. The high concentration implant of FIG. 8F provides a higher concentration than the LDD implant of FIG. 8E. Diffused region 20 is implanted with the same type of impurity as first portion 26. After the high concentration implantation, diffused region 20 diffuses further into well 14, and first portion 26 now contains a higher concentration of impurity. Therefore, center portion 28 contains a lower concentration of impurities than first portion 26. Photoresist 65 is then removed. In one embodiment, a high concentration of an n-type impurity is implanted, and first portion 26 becomes the n-portion of an SBPD.

Figure 8G:
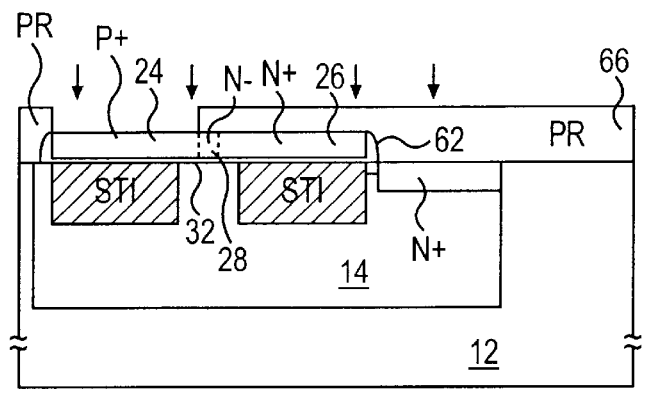
Figure 8H:
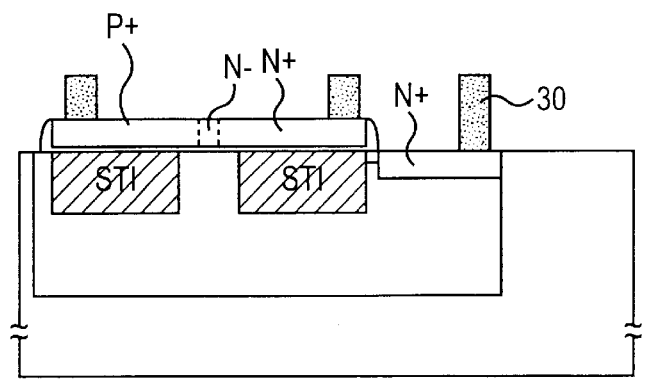

Referring to FIG. 8G, a photoresist 66 is deposited over silicon layer 32, spacers 62, well 14, and substrate 12. Photoresist 66 is patterned and defined to expose a second portion 24 of silicon layer 32. An impurity of a different type than the LDD and high concentration implants of FIGS. 8E and 8F is implanted into second portion 24. Second portion 24 is heavily doped with the different impurity. In one embodiment, second portion 24 is heavily doped with a p-type impurity and become the p-portion of an SBPD. Photoresist 66 is then removed. Referring to FIG. 8H, conventional semiconductor processing follows to form a plurality of contacts 30.

Figure 9A:
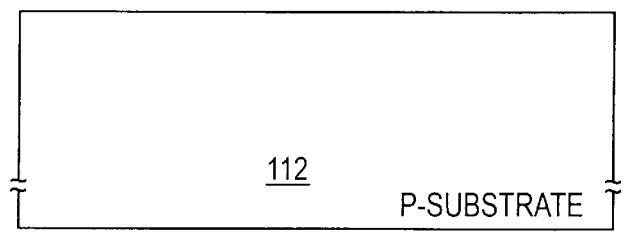
FIGS. 9A–9H are cross-sectional views of the steps in a method of forming a substrate-biased silicon diode with a p-type center region.
Figure 9B:
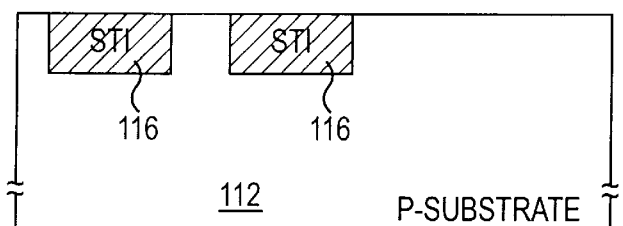
Figure 9C:
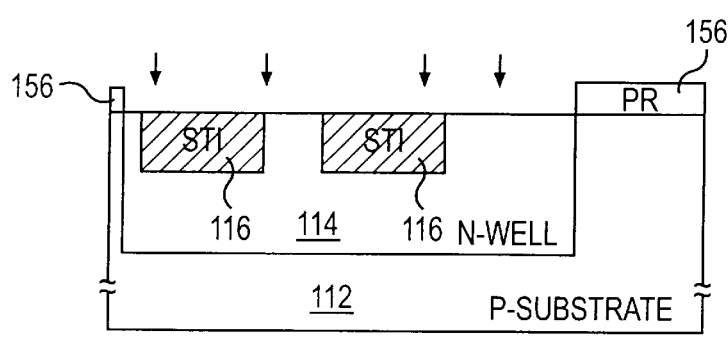

Similar to the method of forming an SBPD shown in FIGS. 8A–8H above, FIGS. 9A–9H are cross-sectional views of the steps in a method of forming a substrate-biased silicon diode with a p-type center region. Referring to FIG. 9A, a p-type semiconductor substrate 112 is prepared and defined. FIG. 9B shows the formation of STIs 116 inside semiconductor substrate 112. STIs 116 may be formed using the process steps described above. FIG. 9C shows an n-well implantation to form an n-well region. Referring to FIG. 9C, after a photoresisit 156 is patterned and defined, substrate 112 is doped with an n-type impurity to form n-well 114. In addition, STIs 116 are now disposed inside n-well 114. After implantation, photoresist 156 is removed.

Figure 9D:
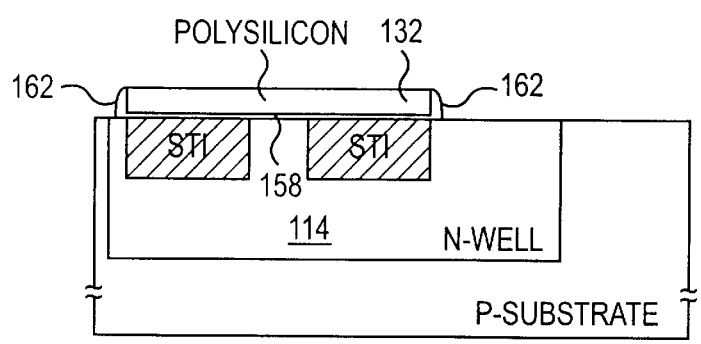

Referring to FIG. 9D, a thin oxide layer 158 is grown over the surface of n-well 114. A layer of silicon 132 is then deposited over oxide layer 158. A photoresist (not shown) is used to pattern and define polysilicon layer 132 during etching to form the structure shown in FIG. 9D. Conventional steps follow to form spacers 162 contiguous with polysilicon layer 132. Spacers 162 may be oxide spacers or nitride spacers.

Figure 9E:
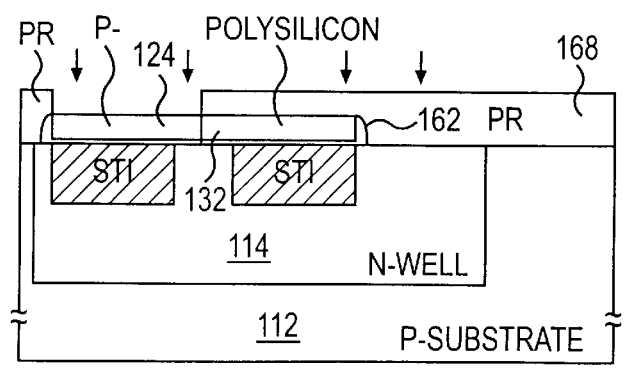

Referring to FIG. 9E, after a photoresist 168 is deposited over polysilicon layer 132, spacers 162, n-well 114, and substrate 112, photoresist 168 is patterned and defined to expose a second portion 124 of polysilicon layer 132 and a portion of polysilicon layer 132 that would later become a center portion 128. A p-type lightly-doped drain (LDD) is implanted into second portion 124 and center portion 128. Photoresist 168 is removed after the implantation step.

Figure 9F:
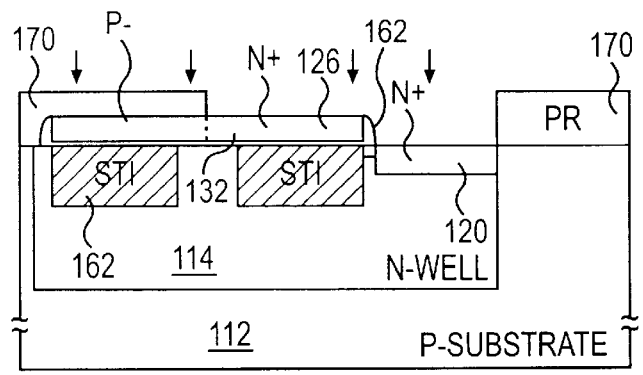

Referring to FIG. 9F, a photoresist 170 is deposited over polysilicon layer 132, spacers 162, n-well 114, and substrate 112. Photoresist 170 is patterned and defined to expose a first portion of polysilicon layer 126 and a portion of n-well 114. A high-concentration n-type impurity of implanted into first portion 126 and the portion of n-well 114. Implanted portion of n-well 114 becomes an n-type diffused region 120. Photoresist 170 is then removed.

Figure 9G:
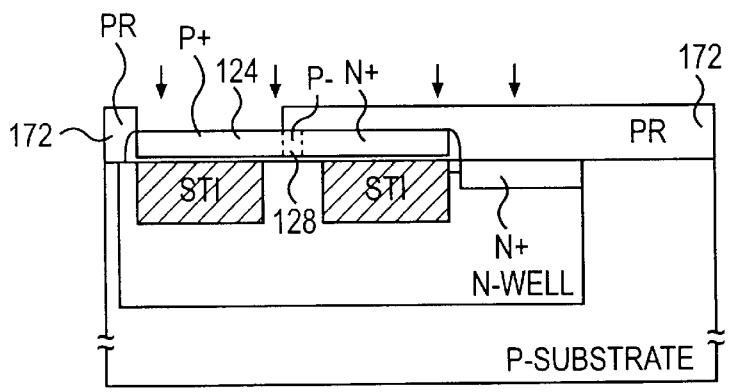
Figure 9H:
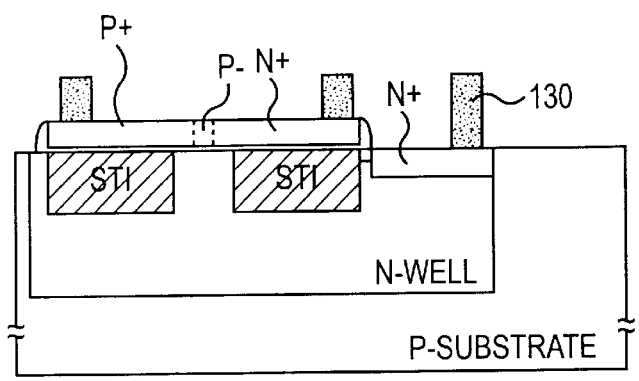

Referring to FIG. 9G, a photoresist 172 is laid down and patterned. Using photoresist 172 as a mask, a high concentration of a p-type impurity is implanted into second portion 124. The implantation concentration of the step shown in FIG. 9G is larger than that of the LDD implantation step shown in FIG. 9E. The p-portion 124 of an SBPD is formed and contains a higher impurity concentration than center region 128 of the SBPD. Photoresist 172 is then removed. Referring to FIG. 9H, conventional semiconductor processing follows to form a plurality of contacts 130.

For a silicon diode of the present invention manufactured using an SOI technology, a modification of the manufacturing processes described above will be required. However, the modification will be limited to the few steps at the beginning of the manufacturing process unrelated to the manufacturing steps for the formation of the silicon diode. With the exception of the steps related to the creating of a well region, the manufacturing steps described above follow to manufacture a base-biased silicon diode of the present invention as described above.

Figure 10:
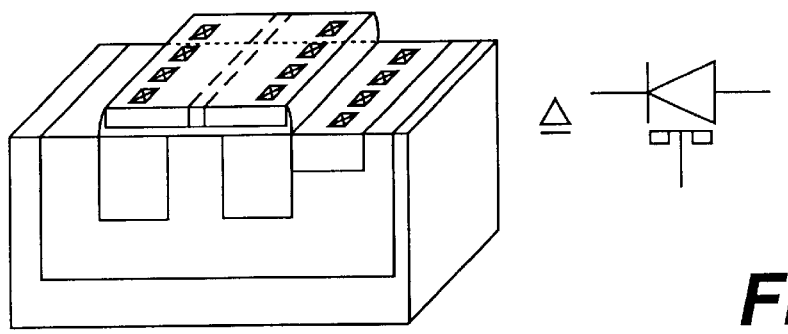
FIG. 10 shows the circuit symbol for the substrate-biased silicon diode of the present invention relative to the cross-sectional view of the diode.
Figure 11:
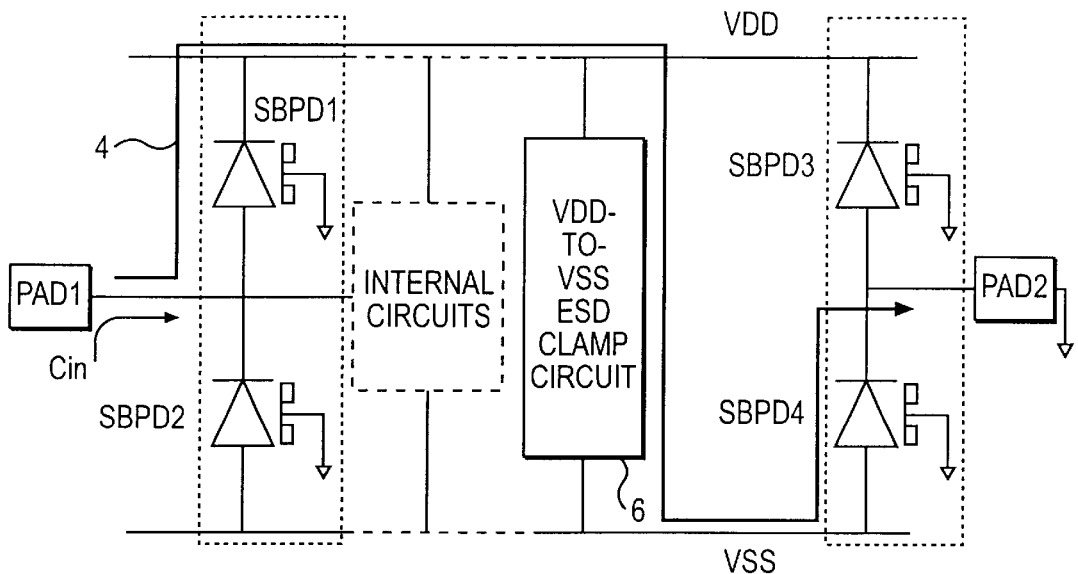
FIG. 11 is a circuit diagram of an ESD protection circuit with dual substrate-biased silicon diodes of the present invention.

FIG. 10 is a circuit symbol for an SBPD of the present invention relative to the cross-sectional view of the diode. FIG. 11 is a circuit diagram of an ESD protection circuit with two dual-SBPDs. The first dual SBPDs include SBPD1 and SBPD2, and second dual SBPDs include SBPD3 and SBPD4. Referring to FIG. 11, dual silicon diodes SBPD1 and SBPD2 are used in a forward-biased condition to discharge an ESD current so that the ESD current does not damage the internal circuits. When an ESD current 4 is applied to Pad1, and with Pad2 grounded relative to Pad1, an ESD current 4 is conducted to VDD through silicon diode SBPD1. ESD current 4 is then discharged to the VSS line through a VDD-to-VSS ESD clamp circuit 6 and flows out of the IC through SBPD4.

Therefore, the present invention also includes a method for protecting a CMOS semiconductor device from electrostatic discharge. The method provides a signal to the semiconductor device through a CMOS semiconductor circuit that includes at least one substrate-biased silicon diode to protect the semiconductor device from electrostatic discharge. Similarly, the present invention also includes a method for protecting a silicon-on-insulator semiconductor device from electrostatic discharge. The method provides a signal to the device through a silicon-on-insulator circuit that includes at least one base-biased silicon diode to protect the semiconductor device from electrostatic discharge.

Figure 1B:
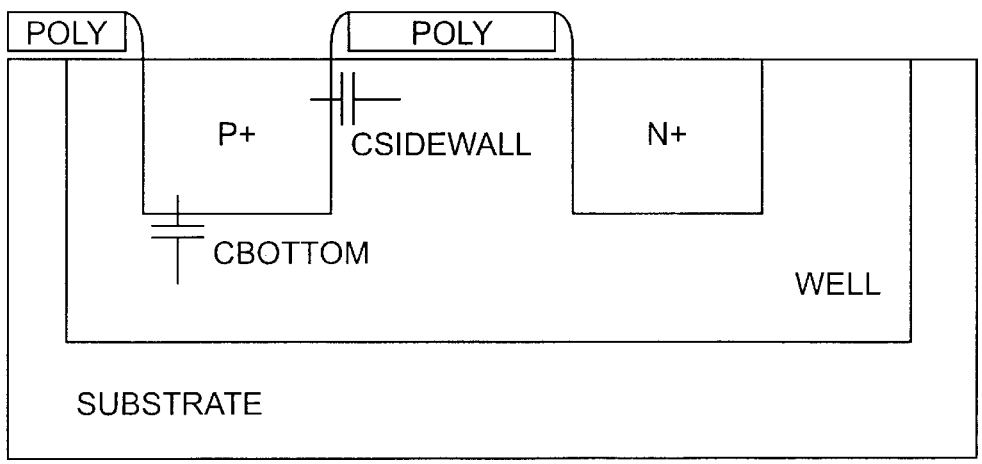
FIG. 1B shows a cross-sectional view of another known diode structure formed in an integrated circuit.
Figure 2:
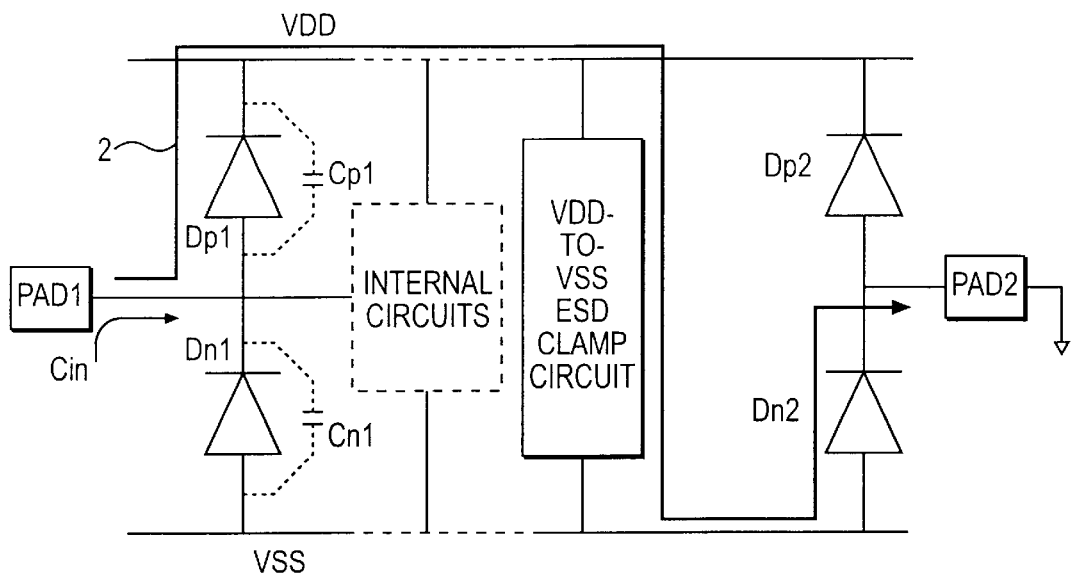
FIG. 2 is a circuit diagram of a known ESD protection circuit.
Figure 3:
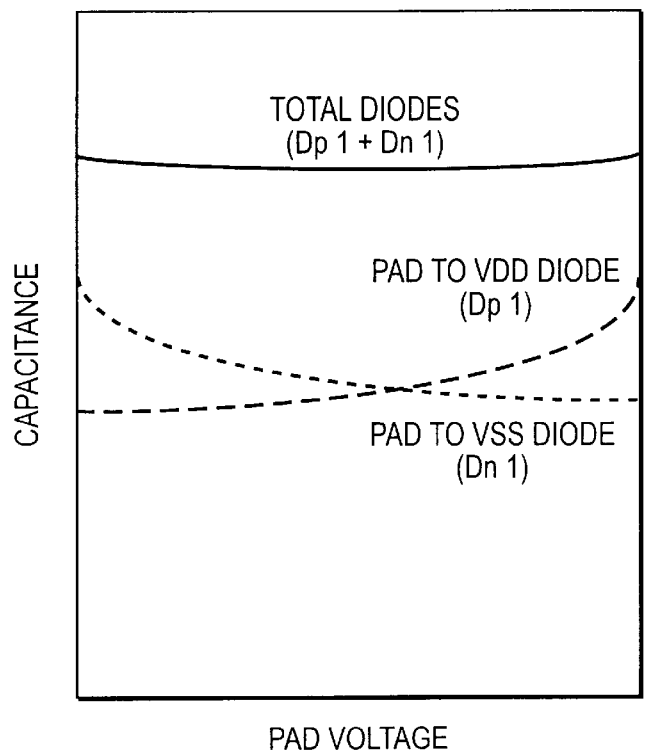
FIG. 3 is plot showing the relationship between a pad voltage and parasitic input capacitance of the circuit shown in FIG. 2.
Figure 12A:
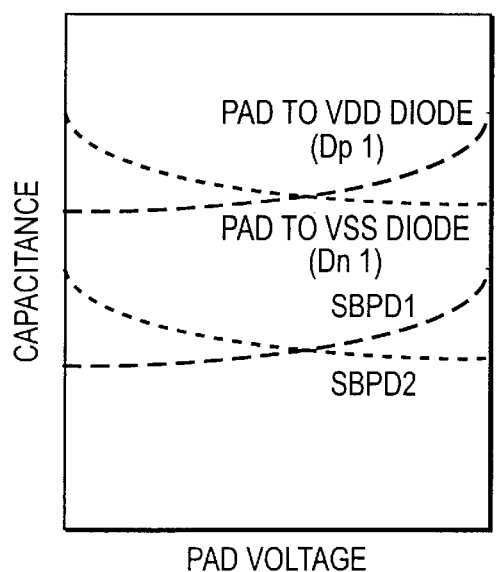
FIG. 12A is plot showing the relationship between a pad voltage and individual parasitic input capacitance of the dual substrate-biased silicon diodes of FIG. 10.
Figure 12B:
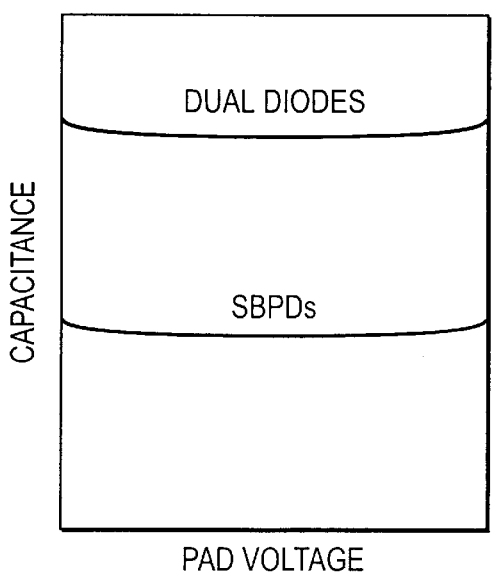
FIG. 12B is plot showing the relationship between a pad voltage and total parasitic input capacitance of the dual substrate-biased silicon diodes of FIG. 10.

FIG. 12A is plot showing the relationship between a pad voltage and individual parasitic input capacitance of the dual substrate-biased silicon diodes of FIG. 11. When the n-well region of an SBPD is biased to ground, the parasitic capacitance of the SBPD is approximately half of the polysilicon-bound diode of FIG. 1B because, unlike a polysilicon-bound diode, an SBPD does not have a bottom junction capacitance, $C_{bottom}$. As shown in FIG. 12A, the capacitance variation of an SBPD relative to pad voltages is similar to that of a polysilicon-bound diode as shown in FIG. 3. Therefore, the total input capacitance $C_{in}$ of the dual SBPDs of FIG. 11 is also approximately half of the dual polysilicon-bound diodes. This relationship is shown in FIG. 12B.

The input parasitic capacitance of SBPDs may be further reduced by connecting a plurality of SBPDs in series because capacitances connected in series lower the total capacitance. FIG. 13A is a circuit diagram of one embodiment of an ESD protection circuit using dual SBPDs. Assuming each of the SBPDs has the same capacitance C, the total capacitance for FIG. 13A is 2C. FIG. 13B is a circuit diagram of one embodiment of an ESD protection circuit using two dual-SBPDs. The total capacitance for FIG. 13B is C. FIG. 13C is a circuit diagram of another embodiment of an ESD protection circuit using dual SBPD strings. The total capacitance for FIG. 13C is 2C/n, wherein n represents the number of SBPDs.

FIG. 14 is a circuit diagram of one embodiment of an ESD protection circuit with biased dual SBPDs of the present invention. Referring to FIG. 14, an integrated circuit device 74 receives signals from a signal pad 76. Device 74 includes a pair of SBPDs 78 and 80, responsive to the signals from signal pad 76 for providing electrostatic discharge protection from the signals. Each of SBPDs 78 and 80 includes a p-portion and an n-portion (not numbered) and signal pad 76 is coupled to the p-portion of one of the pair of SBPDs and the n-portion of the other one of the pair of SBPDs. In one embodiment of the invention as shown in FIG. 11, device 74 additionally comprises a second pair of SBPDs, SBPD3 and SBPD4, coupled to clamp circuit 6. In another embodiment as shown in FIG. 13C, each of the pair of SBPDs 78 and 80 of FIG. 14 includes a plurality of serially coupled SBPDs.

Referring again to FIG. 14, device 74 further comprises a detection circuit 86 for detecting signals from signal pad 76 and providing a bias voltage to SBPDs 78 and 80. In one embodiment, an integrated circuit that receives electrostatic charges from a signal pad comprises a plurality of serially coupled SBPDs responsive to the electrostatic pulses from the signal pad for providing electrostatic discharge protection from the signals. Detection circuit 78 comprises a resistor-capacitor (R-C) circuit having a delay constant longer than the duration of the electrostatic pulses. The resistor-capacitor circuit is coupled in parallel with a transistor network. The transistor network comprises a first transistor 84, and a second transistor 82, and each of the transistors includes a gate, source and drain. The gate of first transistor 84 is coupled to the gate of second transistor 82 and the resistor-capacitor circuit. In addition, the drain of first transistor 84 and the drain of the second transistor 82 are coupled to a substrate of SBPDs 78 and 80. The source of first transistor 84 is coupled to a VDD signal and the source of second transistor 82 is coupled to a VSS signal. In operation, the drain of first transistor 84 and the drain of the second transistor 82 are coupled to the substrate of SBPDs 78 and 80 to provide a bias voltage.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device, comprising
   a semiconductor substrate;
   a well region formed inside the semiconductor substrate;
   a first isolation structure formed inside the well region;
   a second isolation structure formed inside the well region and spaced apart from the first isolation structure;
   a dielectric layer disposed over the well region; and
   a layer of silicon, formed over the dielectric layer, including a p-type portion, an n-type portion and a center portion disposed between the p-type and n-type portions, wherein the p-type portion overlaps the first isolation structure and the n-type portion overlaps the second isolation structure.

2. The integrated circuit device as claimed in claim 1, wherein the center portion of the layer of silicon is doped with an n-type impurity having a doped concentration lower than that of the n-type portion.

3. The integrated circuit device as claimed in claim 1, wherein the center portion of the layer of silicon is doped with a p-type impurity having a doped concentration lower than that of the p-type portion.

4. The integrated circuit device as claimed in claim 1, wherein the center portion of the layer of silicon is undoped.

5. The integrated circuit device as claimed in claim 1, wherein the center portion overlaps a portion of the well region between the first and second isolation structures.

6. The integrated circuit device as claimed in claim 1, further comprising a diffused region formed inside the well region adjacent one of the first and second isolation structures.

7. The integrated circuit device as claimed in claim 6, wherein the diffused region is biased to cause the well region to be biased to control the silicon layer for providing electrostatic discharge protection.

8. An integrated circuit device receiving signals from a signal pad, comprising:
    at least one substrate-biased silicon diode responsive to the signals from the signal pad for providing electrostatic discharge protection, wherein the at least one substrate-biased silicon diode includes
        a p-type polysilicon,
        an n-type polysilicon portion,
        a center polysilicon portion disposed between and contiguous with the p-type and n-type polysilicon portions,
        a first isolation structure, and
        a second isolation structure spaced apart from the first isolation structure,
    wherein the p-type polysilicon portion overlaps the first isolation structure and the n-type polysilicon portion overlaps the second isolation structure.

9. The integrated circuit device as claimed in claim 8, further comprising a diffused region inside a well region adjacent one of the first isolation structure and second isolation structure, wherein the diffused region is doped with a same impurity as the well region.

10. The integrated circuit device as claimed in claim 9, wherein the well region is biased to control the at least one substrate-biased silicon diode for providing electrostatic discharge protection.

11. The integrated circuit device as claimed in claim 9, wherein the diffused region is biased to cause the well region to be biased to control the at least one substrate-biased silicon diode for providing electrostatic discharge protection.

12. An integrated circuit device used for electrostatic discharge protection, comprising:
    a semiconductor substrate;
    a dielectric layer disposed over the substrate; and
    a layer of silicon, formed over the dielectric layer, including a p-type portion and an n-type portion,
    wherein each of the p-type portion and the n-type portion forms one of an anode and a cathode of a substrate-biased diode, and wherein the diode provides electrostatic discharge protection.

13. An integrated circuit device used for electrostatic discharge protection, comprising:
    a semiconductor substrate;
    a dielectric layer disposed over the substrate; and
    a layer of silicon, formed over the dielectric layer, including a p-type portion, an n-type portion, and a center portion disposed between the n-type and p-type portions,
    wherein each of the p-type portion and the n-type portion forms one of an anode and a cathode of a substrate-biased diode, and wherein the diode provides electrostatic discharge protection.

* * * * *